United States Patent [19]

Mizukami et al.

[11] 4,368,230
[45] Jan. 11, 1983

[54] PHOTOMASK

[75] Inventors: Koichiro Mizukami; Masatoshi Migitaka, both of Kokubunji, Japan

[73] Assignee: VLSI Technology Research Association, Japan

[21] Appl. No.: 127,319

[22] Filed: Mar. 5, 1980

[30] Foreign Application Priority Data

Mar. 28, 1979 [JP] Japan .................................. 54-35492

[51] Int. Cl.$^3$ .............................................. B32B 3/00
[52] U.S. Cl. .................................. 428/203; 427/165; 427/269; 427/109; 427/74; 428/432; 428/469; 428/433; 428/434; 428/457; 428/209; 428/210
[58] Field of Search ............... 428/432, 469, 210, 457, 428/203; 427/109, 74

[56] References Cited

U.S. PATENT DOCUMENTS

| | | | |
|---|---|---|---|
| 3,898,359 | 8/1975 | Nadkarni | 428/210 |
| 3,916,056 | 10/1975 | Feldstein | 428/210 |
| 4,000,346 | 12/1976 | Dowell | 427/108 |
| 4,006,070 | 2/1977 | King | 428/432 |
| 4,200,473 | 4/1980 | Carlson | 427/74 |
| 4,256,778 | 3/1981 | Mizukami et al. | 427/35 |

FOREIGN PATENT DOCUMENTS 1406894 9/1975 United Kingdom ............... 427/109

*Primary Examiner*—George F. Lesmes
*Assistant Examiner*—E. Rollins Buffalow
*Attorney, Agent, or Firm*—Antonelli, Terry & Wands

[57] ABSTRACT

A photomask comprises a transparent film of conductive material and a light shielding film of predetermined pattern on a transparent substrate. The pattern film is made of a metallic element having its atomic number not smaller than 25 or a composition containing the metallic element. The photomask structure is suited to the case where the pattern formed on the mask is inspected with an electron beam. With the mask structure, the contrast of a pattern related information signal (backscattered electrons, secondary electrons, absorption current, etc.) derived from the mask upon irradiation thereof with the electron beam is improved.

13 Claims, 15 Drawing Figures

PHOTOMASK

BACKGROUND OF THE INVENTION

The present invention relates to the improvement on photomasks used for the fabrication of semiconductor integrated circuits, and more particularly to the improvement on photomasks suited to the case where patterns formed thereon are inspected while using electron beams as probe means.

The inspection of a pattern on a photomask with an electron beam includes successively irradiating the surface portions of the photomask under consideration with the electron beam and detecting a signal representative of pattern related information derived from the mask. As such a signal can be used backscattered electrons, secondary electrons, absorption current, etc. The checking of an object surface condition utilizing backscattered electrons, secondary electrons, absorption current, etc. derived from the object upon irradiation thereof with an electron beam is well known. For example, U.S. Pat. No. 3,381,132 discloses the analysis of a specimen utilizing secondary electrons and backscattered electrons, and U.S. Pat. No. 3,549,999 discloses the testing of integrated circuits utilizing secondary electrons. Since the intensity of the above-described information signal varies depending upon the kind of the mask surface material, it is possible to inspect the configuration and size of the pattern by detecting such a signal while successively scanning the mask surface with the electron beam.

The electron beam scanning process would require provision for preventing the mask surface from being charged by the scanning electrons. One approach for that purpose is proposed by U.S. application Ser. No. 925,791 filed July 18, 1978 by Koichiro Mizukami and Masatoshi Migitaka, now U.S. Pat. No. 4,256,778, and assigned to the assignee of the present application (corresponding to German patent application No. P2832151.9 filed July 21, 1978). This patent application proposes to dispose a transparent conductive layer on the mask surface or to make the mask substrate of a transparent conductive material. The electron beam is irradiated under a condition in which the conductive layer or substrate is connected to a predetermined potential such as a ground potential. Various examples of such a conductive mask are shown in FIGS. 1A to 1C. In the figures, reference numeral 1 designates a transparent substrate of insulating material such as glass, 2 a transparent film of conductive material, 3 a mask pattern or light shielding film of chromium (Cr), and 4 a transparent substrate of conductive material.

FIG. 2A schematically illustrates a signal obtained when the vicinity of the pattern of the mask shown in FIG. 1A is scanned with an electron beam. The mask pattern defines that portion of the mask serving as a light shield when the fingers on the mask is transferred onto a resist, and is hereinafter referred to simply as "pattern." An actual signal which can be observed would include noises as shown in FIG. 2B. The increased beam scanning rate for reducing a pattern inspection time would require a correspondingly increased signal detecting speed. In that case, the noises contained in the detected signal would be enhanced, as shown in FIG. 2C, thereby rendering the discrimination of a difference in signal intensity due to the presence/absence of the pattern difficult and remarkably deteriorating the reliability of results. However, if the signal intensity is obtained with a greatly distinguishable difference between pattern and non-pattern portions, as shown in FIG. 2D, it can be expected that the presence/absence of the pattern may be correctly recognized even if large noises are contained in the detected signal. In other words, if a mask itself is constructed so that it exhibits a high contrast (the ratio of a pattern related signal intensity to a non-pattern related signal intensity, and vice versa, namely, the ratio of the higher intensity to the lower intensity) through the scanning by an electron beam, the signal detecting speed can be enhanced without deteriorating the reliability of detected results.

FIG. 3 shows the present inventors' experimental results in which the contrast of backscattered-electron signal derived upon irradiation with electron beams is measured for mask samples which have the same structure as that of FIG. 1A and comprise a film of indium oxide $In_2O_3$ (the actually used material containing a small amount of Sn and having the In/O ratio slightly deviated from $\frac{2}{3}$) of a thickness of $d_1 \approx 2,000$ Å as the transparent conductive layer 2 and Cr films of various thicknesses $d_2$ as the pattern film 3. It can be seen from FIG. 3 that the sample having the thickness of $d_2 = 1,000$ Å exhibits the maximum contrast. But, the maximum contrast as low as approximately 1.1 cannot allow an increase of checking speed. A main factor for the low contrast is considered to be a contribution of the underlying conductive material to the backscattered-electron signal intensity resulting from the penetration of an incident electron beam throughout the Cr film 3. Though the thickness $d_2$ of the Cr film increased up to a value at which backscattered electrons from the underlying material are negligible would provide a signal intensity indicating a difference in surface material, it has been found that the thickness $d_2$ above 5,000 Å is necessary under an electron beam accelerating voltage of 20 KV for that purpose. Further, such an increased thickness $d_2$ of pattern film makes the formation of a finely defined pattern difficult. Though the required pattern thickness can be decreased if the beam accelerating voltage is lowered, there would be drawbacks such as the deterioration of S/N ratio due to the decrease of beam current and the instability of beam position.

SUMMARY OF THE INVENTION

An object of the present invention is to provide a photomask in which the contrast of pattern related information signal derivable upon irradiation with an electron beam is high.

A photomask of the present invention comprises on a transparent substrate a transparent film of conductive material and a light shielding film of predetermined pattern. According to one aspect of the present invention, the pattern film is made of a metallic element having its atomic number not smaller than 25 (preferably, not smaller than 72) or a composition containing the metallic element. According to another aspect of the present invention, it is preferable that the ratio of the electron backscattering coefficient of the pattern film to that of the transparent conductive film is equal to or larger than about 1.3 (as the optimum value, equal to or larger than 1.5). Also, it is preferable that the thickness of the pattern film is equal to or larger than about 0.2 times (as the optimum value, 0.5 times) of the mean range of electron in the material forming the pattern film.

DESCRIPTION OF THE PREFERRED EMBODIMENTS

Now, the principle and various embodiments of the present invention will be explained referring to FIGS. 4 to 10.

Figure 4:
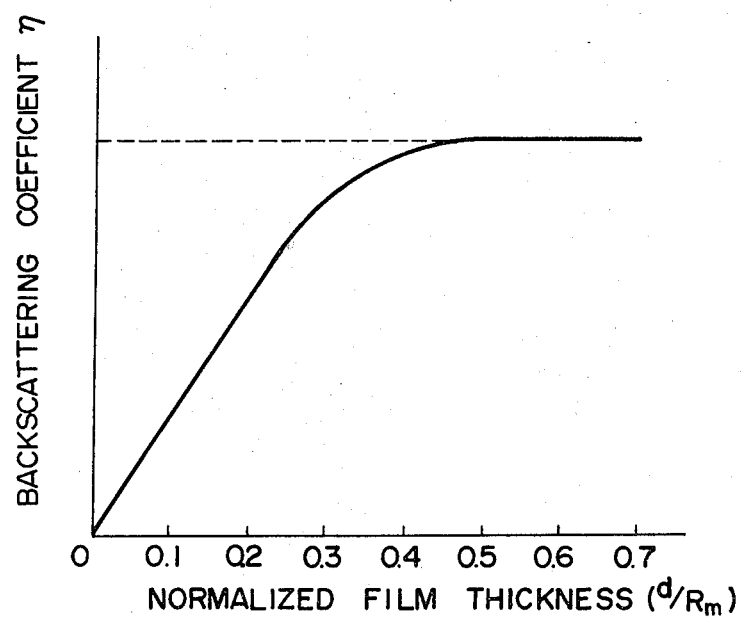
FIG. 4 graphically shows a relationship between the backscattering coefficient of a thin film and the thickness of the thin film which is useful in explaining the principle of the present invention.

A general relationship between the thickness of a thin film and the intensity of backscattered electrons derived from the thin film (or the amount of charges generated as backscattered electrons per unit time) upon irradiation thereof with an electron beam is illustrated in FIG. 4. In the figure, the ordinate represents the backscattered-electron intensity normalized by a beam current (i.e. a current entering the thin film). The normalized intensity is equal to the so-called backscattering coefficient $\eta$ which defines the total flow or number of backscattered electrons generated per incident electron. FIG. 4 shows that the backscattered-electron intensity increases with the increase of film thickness d but exhibits a constant value inherent to the film forming material if the thickness d exceeds a half of the main range $R_m$ of electron in the film forming material. The magnitude $R_m$ is defined as a penetration depth at which the average energy of electron entering a material under consideration becomes zero, the depth depending upon the kind of the used material (and the magnitude of a beam accelerating voltage).

Figure 5:
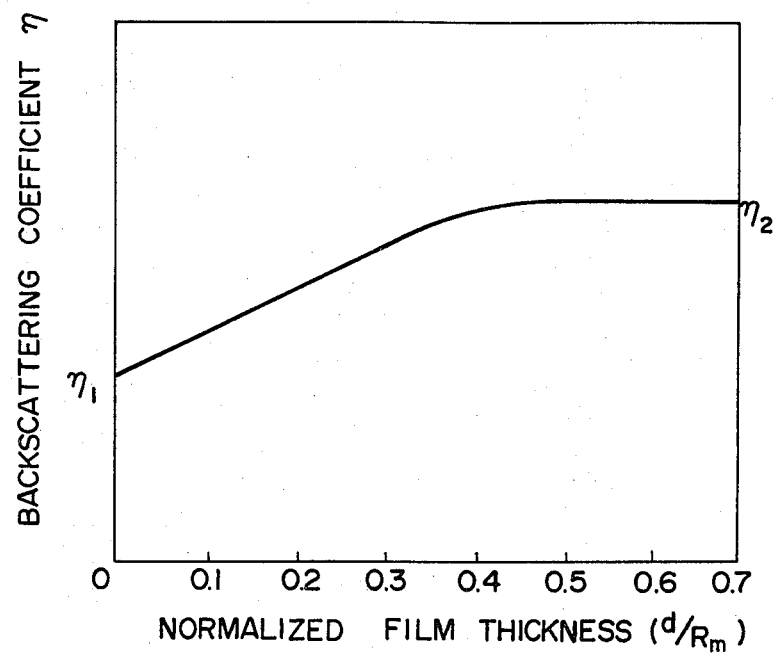
FIG. 5 graphically shows a relationship between the backscattering coefficient for a structure having a thin film formed on a substrate material, and the thickness of the thin film, which is useful in explaining the principle of the present invention.
Figure 6:
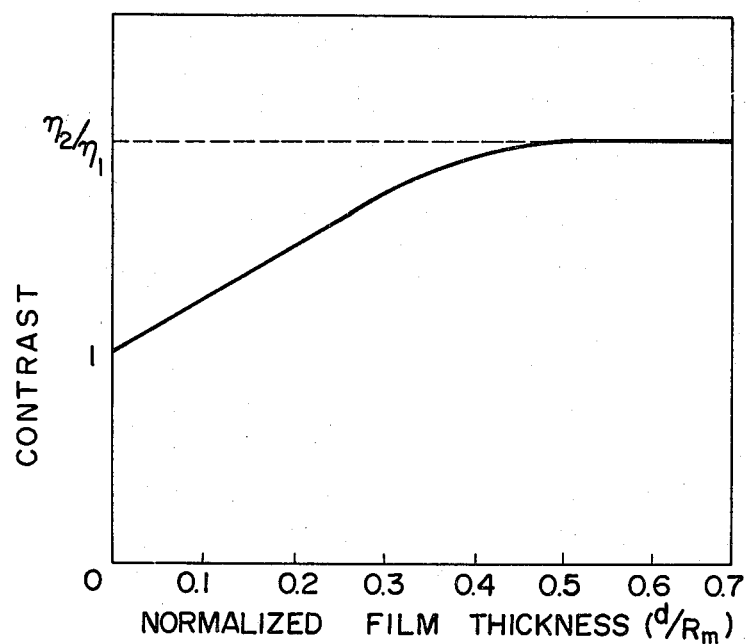
FIG. 6 graphically shows a relationship between the contrast for a mask having a pattern film formed on a conductive film, and the thickness of the pattern film, which is useful in explaining the present invention.

When a thin film made of a material having its backscattering coefficient $\eta_2$ is formed on a material having its backscattering coefficient $\eta_1$, a relationship between the backscattered-electron intensity or backscattering coefficient $\eta$ for the composite structure and the thickness d of the thin film would be assumed as shown in FIG. 5 if $\eta_1 < \eta_2$. Therefore, for a mask in which a pattern made of a material having its backscattering coefficient $\eta_2$ is formed on a conductive substrate having its backscattering coefficient $\eta_1$ (or a glass substrate having a conductive surface film), one can expect the contrast as shown in FIG. 6. From the figure, it is understood that the available maximum contrast is equal to the ratio $\eta_2/\eta_1$ and the pattern forming film thickness d of at least $R_m/2$ is necessary to obtain the maximum contrast. From the foregoing, it can be recognized that the following conditions are advantageous for improving the contrust of a conductive mask:

(1) that a material having a smaller value of $R_m$ is used as the pattern forming material; and (2) that the pattern film forming material and the conductive film forming material are selected with a large ratio between the backscattering coefficients $\eta$ of both materials.

On the other hand, it is known that a material having a smaller value of $R_m$ generally coincides with one having a larger value of $\eta$ and such a material is an element having a larger atomic number Z or a composition thereof such as a compound or a mixture. Accordingly, the above conditions (1) and (2) can be represented as follows:

(3) that it is preferable to use a pattern forming material having the backscattering coefficient $\eta$ (or atomic number Z) as large as possible on one hand and to use a conductive film forming material having the backscattering coefficient $\eta$ (or atomic number Z) as small as possible on the other hand.

When a composition material such as a compound or a mixture is used, one can take as the atomic number Z the weighted average of respective atomic numbers of its constituent elements. For example, the weighted average for a composition $A_x B_y$ including an element A of atomic number $Z_A$ and an element B of atomic number $Z_B$ is defined as $(xZ_A + yZ_B)/(x+y)$.

Glass normally used as the mask substrate is one material having a smaller value of $\eta$. Therefore, even if a conductive film formed on the glass substrate is made of a material having a larger value of $\eta$, the intensity of backscattered electrons from the conductive film gets near that from the glass substrate when the conductive film is made thinner. Thus, it is possible to effectively make the backscattering coefficient $\eta$ of the conductive film small. The $\eta$ of the conductive film in that case can be called "effective" backscattering coefficient and it should be noted that the term "backscattering coefficient" used in the present invention with respect to the conductive film includes the effective backscattering coefficient.

The requirement for only the above condition (2) may be satisfied by the combination of a conductive substrate having a larger value of $\eta$ and a pattern film having a smaller value of $\eta$. In the case, however, a sufficient contrast cannot be attained unless the pattern film is made thicker. The increased thickness of the pattern film renders the formation of a finely defined pattern difficult.

Figure 1A:
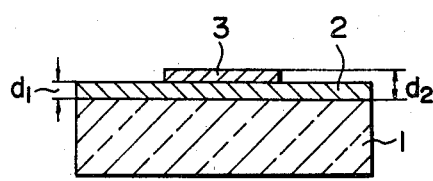
FIGS. 1A to 1C show in cross section examples of a photomask disclosed in the U.S. application Ser. No. 925,791 (or German patent application No. P2832151.9).
Figure 1B:
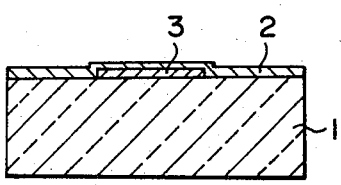
Figure 1C:
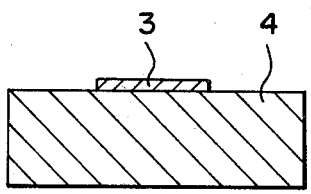
Figure 2A:
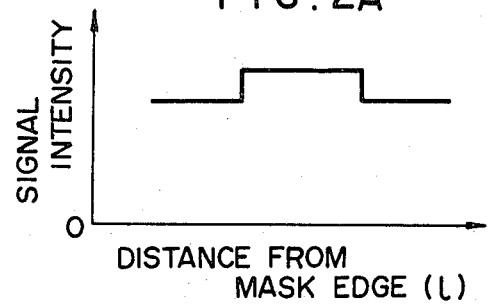
FIGS. 2A to 2C show schematic waveforms of signals derived from the vicinity of a pattern when the photomask shown in FIG. 1A is scanned with an electron beam.
Figure 2B:
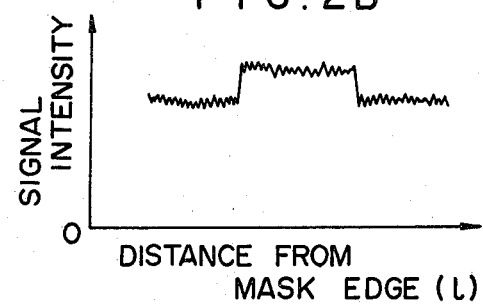
Figure 2C:
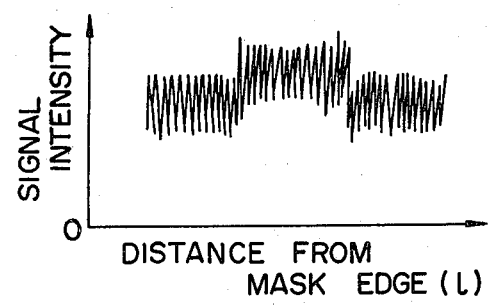
Figure 2D:
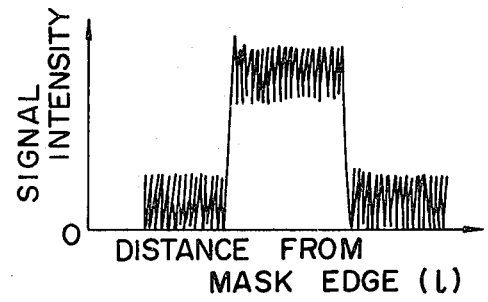
FIG. 2D shows a schematic signal waveform for explaining an ideal contrast of signal intensity between pattern and non-pattern portions.

The foregoing explanations have been made in conjunction with the mask structure shown in FIG. 1A. The same holds for the mask structures shown in FIGS. 1B and 1C. Also, the similar can be said when secondary electrons or absorption current are detected instead of backscattered electrons. Since secondary electrons are produced by not only primary electrons incident on a sample surface but also backscattered electrons passing near the surface, the coefficient $\delta$ of generation of secondary electrons (or the number of secondary electrons generated per incident electron) can be expressed as follows:

$$\delta = \delta_{SE} + \eta \delta_{RE} \quad (1)$$

Here, $\delta_{SE}$ is the number of secondary electrons produced directly by one incident electron and $\delta_{RE}$ is the number of secondary electrons produced by one backscattered electron. The equation (1) shows that $\delta$ becomes larger with the increase of $\eta$ and hence a mask exhibiting a high backscattered-electron contrast, i.e. a mask having a large ratio between the backscattering coefficients $\eta$ of the pattern and non-pattern portions is also advantageous to the provision of a large ratio between the secondary-electron generation coefficients $\delta$.

Assuming that a current entering a sample is $I_O$, the absorption current $I_{AE}$ can be represented as follows:

$$I_{AE} = I_O(1 - \eta - \delta) \quad (2)$$

From the equation (2), it can be understood that the combination of materials having greatly different backscattering coefficients $\eta$ provides a large difference between the absorption currents $I_{AE}$. Therefore, a mask exhibiting a high backscattered-electron contrast is also advantageous to the provision of a high contrast of absorption current.

For a photomask of the present invention made on the basis of the above principle, it has been found that a metallic element having its atomic number Z not smaller than 72, e.g. a heavy metal such as tungsten (Z=74), gold (Z=79) and platinum (Z=78), or a composition containing the metallic element may be preferably used as a pattern forming material. Also, it has been found that the ratio of the backscattering coefficient $\eta_2$ of the pattern film to that $\eta_1$ of the transparent conductive film is preferably selected to be equal to or larger than about 1.3 (as the optimum value, equal to or larger than 1.5) and the thickness of the pattern film is preferably selected to be equal to or larger than about 0.2 times (as the optimum value, 0.5 times) of the mean range $R_m$ of electron in the pattern film forming material.

Figure 7:
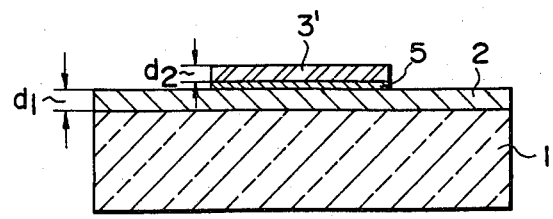
FIG. 7 shows in cross section a main part of a photomask according to one embodiment of the present invention.

FIG. 7 shows a photomask according to one embodiment of the present invention. In the figure, reference numeral 1 designates a transparent substrate of glass, 2 a transparent conductive film of indium oxide ($In_2O_3$) formed on the entire upper surface of the substrate 1 having a thickness $d_1$, and 3' a gold (Au) film of predetermined pattern formed on the transparent conductive film 2 having a thickness $d_2$. Though only one Au film is shown in FIG. 7 for convenience of illustration, the Au film includes a continuous film having a complicated pattern or a plurality of separate films. A thin chromium (Cr) or titanium (Ti) film 5 between the Au film 3' and the transparent conductive film 2 having a thickness of about 100 Å in this example is provided for enhancing an adhesion between the Au film 3' and the $In_2O_3$ film 2.

Figure 3:
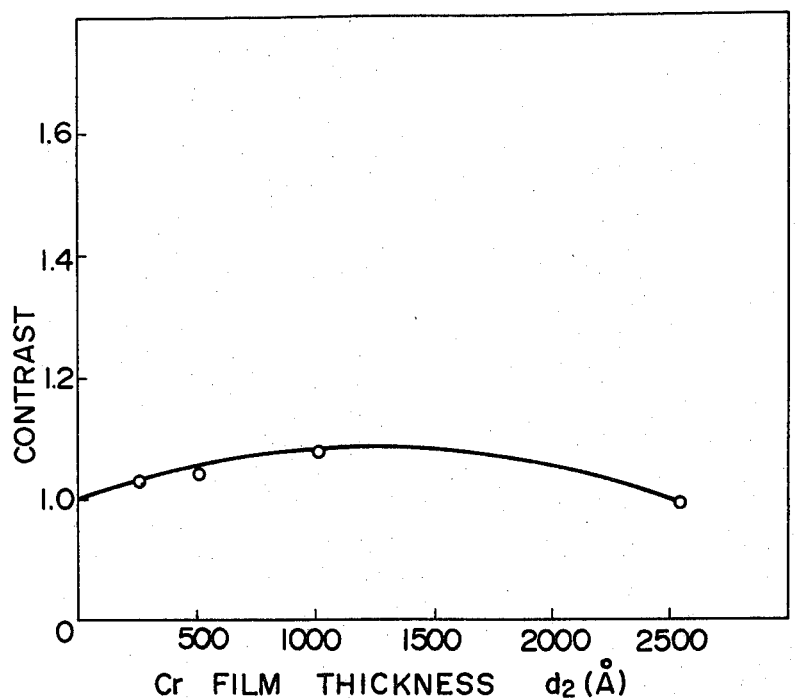
FIG. 3 graphically shows a relationship between the pattern film thickness and the backscattered-electron contrast measured by the present inventors' experiments for the photomask shown in FIG. 1A.
Figure 8:
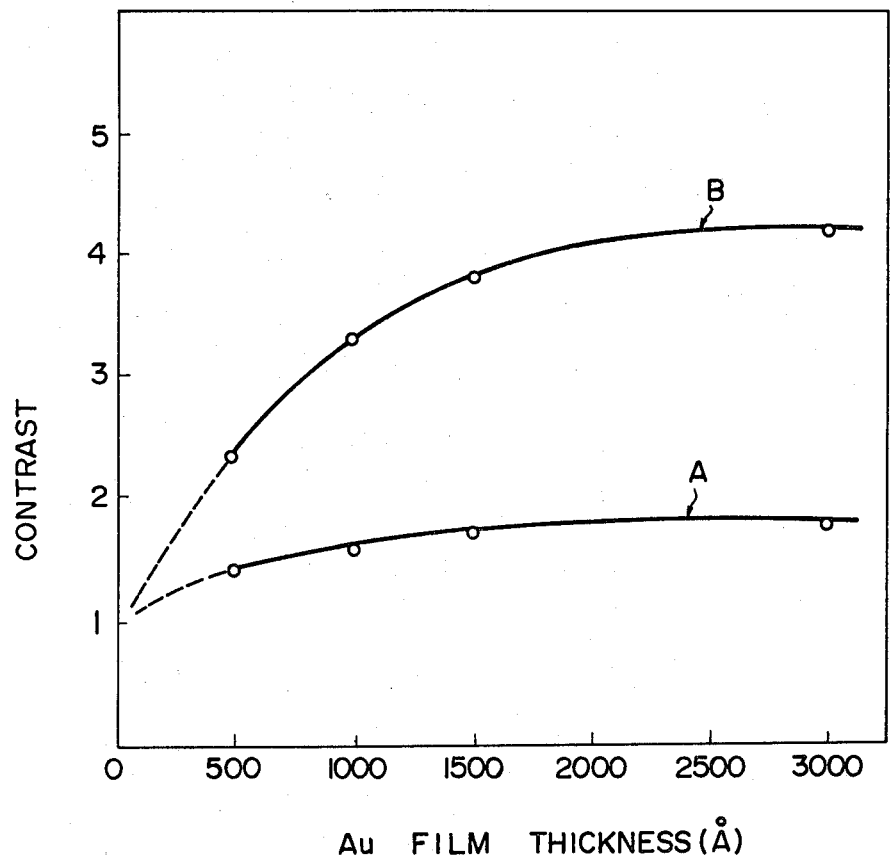
FIG. 8 graphically shows the contrasts obtained when the thickness of the Au film is changed in the photomask of FIG. 7.

The contrasts measured when the thickness $d_2$ of the Au film 3' is changed taking the thickness $d_1$ of the $In_2O_3$ film 2 as a parameter in the photomask shown in FIG. 7, are shown in FIG. 8. Referring to FIG. 8, curve A is plotted for the case of $d_1 = 2,000$ Å and curve B for the case of $d_1 \approx 100$–$200$ Å. It should be understood that the contrast of the photomask for a given value of the pattern or Au film thickness $d_2$ can be controlled by changing the thickness $d_1$ of the transparent conductive film 2. For example, when the Au film 3' has a thickness of $d_2 = 1,000$ Å, the contrast is about 1.5 in the case of $d_1 = 2,000$ Å and about 3.3 in the case of $d_1 \approx 100$–$200$ Å and hence a contrast within a range from 1.5 to 3.3 can be obtained by changing $d_1$ within a range between 2,000 Å and 100 Å. Further, it can be understood that the smaller the thickness $d_1$, the higher the contrast becomes and that the contrast obtained under a condition of $d_1 \leq 2,000$ Å is remarkably improved over all the thicknesses of the Au film 3' when compared with the case of FIG. 3 using the Cr pattern film. Also, it can be said that a relatively low value 1.3 of the contrast is sufficiently practical in comparison with FIG. 3. This contrast value of 1.3 is the maximum contrast available when $\eta_2/\eta_1 = 1.3$ ($\eta_1$: the backscattering coefficient of the transparent conductive film 2, $\eta_2$: the backscattering coefficient of the Au film 3') is satisfied. Accordingly, it can be understood that $\eta_2/\eta_1 \geq 1.3$ (preferably, $\geq 1.5$) provides a sufficient contrast in a practical use.

FIG. 8 further shows that the contrast value saturates in the Au film thickness $\geq 1,500$–$2,000$ Å and hence the Au film thickness of 1,500–2,000 Å is enough to obtain the maximum contrast. Thus, the maximum contrast can be achieved with a relatively small film thickness. As understood from the explanation referring to FIG. 6, the thickness providing the maximum or saturated contrast is equal to or larger than about 0.5 times of the mean range $R_m$ of electron in the Au material forming the pattern film 3'. Considering that even in the case where the thickness of the Au film 3' has a value smaller than the abovespecified value (for example, 1,000 Å corresponding to about 0.2 times of $R_m$) a contrast sufficiently higher than the case of FIG. 3 using the Cr film can be obtained, a practically acceptable thickness of the Au film 3' is equal to or larger than about 0.2 $R_m$ and the optimum thickness is about 0.5 $R_m$.

Though FIG. 8 shows the measured results when the pattern film was made of gold Au having its atomic number of Z=79, similar results has been obtained in the cases where the pattern films were made of tungsten W (Z=74) and platinum Pt (Z=78) respectively.

The review of various materials has revealed that at least one selected from a metallic element having its atomic number not smaller than 72 or a composition containing the metallic element provides preferable results. A suitable metallic element other than Au, W and Pt may include tantalum Ta (Z=73) and lead Pb (Z=82). Further, it has been found that a metallic element having its atomic number larger than that of chromium Cr (Z=24), i.e. the atomic number not smaller than 25, for example, molybdenum Mo (Z=42) can be also used.

The transparent conductive film material may be indium oxide or NESA glass. The use of an oxide of a metallic element having the atomic number smaller than indium In (Z=49), tin Sn (Z=50), for example, titanium Ti (Z=22), zinc Zn (Z=30) can provide a higher contrast.

Figure 9:
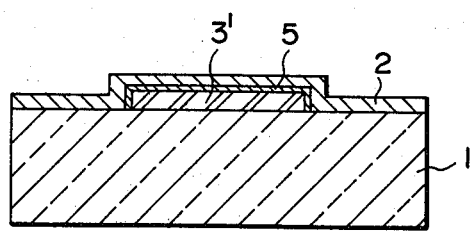
FIGS. 9 and 10 show in cross section the respective main parts of photomasks according to other embodiments of the present invention.
Figure 10:
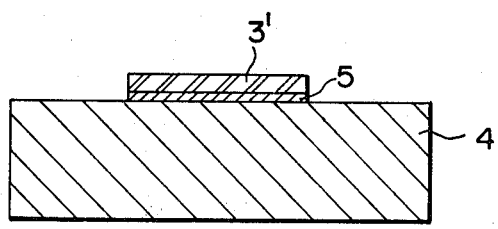

In the foregoing, the embodiment has been described in conjunction with the photomask structure shown in FIG. 1A. The present invention is also applicable to the photomask structures shown in FIGS. 1B and 1C. FIG. 9 shows a photomask according to another embodiment of the present invention in which a mask pattern 3' of a heavy metal such as Au is formed on a transparent substrate 1 of insulating material such as glass and a transparent conductive film 2 is formed on the resultant structure. FIG. 10 shows a photomask according to still another embodiment of the present invention in which a mask pattern 3' of a heavy metal such as Au is formed on a transparent substrate 4 made of a conductive material. In FIGS. 9 and 10, reference numeral 5 designates a film for enhancing an adhesion between the pattern film 3' and the conductive film 2 or the conductive substrate 4, like the film 5 shown in FIG. 7.

The present invention is by no means limited to the above specified embodiments or descriptions, but admits various modifications or changes within the spirit of the present invention.

We claim:

1. A photomask suitable for inspecting a pattern formed thereon with electron beams comprising:
a transparent substrate comprised of glass;
a transparent electrically conductive film comprised of metal oxide formed of at least one first metallic element; and
a light shielding film of predetermined pattern provided on said transparent electrically conductive film, said pattern film being comprised of at least one material selected from the group consisting of a second metallic element having an atomic number not smaller than 25 and a composition containing said second metallic element, said first and second metallic elements being different from each other and the ratio of the electron backscattering coefficient of said pattern film to that of said transparent electrically conductive film being equal to or larger than about 1.3

2. A photomask suitable for inspecting a pattern formed thereon with electron beams comprising:
a transparent substrate comprised of glass;
a light shielding film of predetermined pattern provided on said substrate, said pattern film being comprised of at least one material selected from the group consisting of a metallic element having an atomic number not smaller than 25 and a composition containing said metallic element; and
a transparent electrically conductive film being comprised of metal oxide formed of at least one metallic element and provided on a surface of said substrate including said pattern film, the metallic elements forming said light shielding film and the transparent electrically conductive film being different from each other and the ratio of the electron backscattering coefficient of said pattern film to that of said transparent electrically conductive film being equal to or larger than about 1.3.

3. A photomask according to claim 1 or 2, wherein the thickness of said pattern film is equal to or larger than about 0.2 times of the mean range of electron in the material forming said pattern film.

4. A photomask according to claim 1 or 2, wherein said metallic element of said pattern film is one selected from a group consisting of gold, platinum, tungsten, tantalum, lead and molybdenum.

5. A photomask according to claim 1 or 2, wherein the thickness of said transparent conductive film is not larger than about 2,000 Å.

6. A photomask according to claim 1 or 2, further comprising an adhesive film provided between said transparent conductive film and said pattern film.

7. A photomask suitable for inspecting a pattern formed thereon with electron beams comprising, on a transparent glass substrate, an electrically conductive transparent film and a light shielding film of predetermined pattern, said light shielding film being formed of at least one metal selected from the group consisting of gold, platinum, tungsten, tantalum, lead and molybdenum and said electrically conductive transparent film being formed of metal oxide of at least one metal selected from the group consisting of indium, tin, titanium and zinc, the thickness of said light shielding film of a predetermined pattern being equal to or larger than about 0.2 times the mean range of electron in the material forming said pattern film.

8. A photomask according to claim 7, wherein the thickness of said electrically conductive transparent film is not larger than about 2000 Å.

9. A photomask suitable for inspecting a pattern formed thereon with electron beams comprising:
a transparent glass substrate;
a transparent electrically conductive film formed on said transparent glass substrate, said transparent electrically conductive film being formed of metal oxide of at least one metallic element having an atomic number equal to or smaller than 50; and
a light shielding film of predetermined pattern provided on said transparent electrically conductive film, said pattern film being formed of at least one material selected from the group consisting of another metallic element having an atomic number not smaller than 72 and a composition containing said another metallic element.

10. A photomask according to claim 9, wherein said another metallic element is selected from the group consisting of gold, platinum, tungsten, tantalum and lead.

11. A photomask according to claim 10, wherein said metallic element of the conductive film is at least one metal selected from the group consisting of indium, tin, titanium and zinc.

12. A photomask according to claim 7 or 9, wherein the ratio of the electron backscattering coefficient of said pattern film to that of said transparent electrically conductive film is equal to or larger than about 1.3.

13. A photomask according to claim 9, wherein the thickness of said light shielding film is in a range of from 1500 to 2000 Å.

* * * * *